(12) United States Patent
Polak et al.

(10) Patent No.: US 11,723,182 B2
(45) Date of Patent: Aug. 8, 2023

(54) SHIELDING FILM AND METHOD FOR PRODUCING A SHIELDING FILM

(71) Applicant: VACUUMSCHMELZE GMBH & CO. KG, Hanau (DE)

(72) Inventors: Christian Polak, Blankenbach (DE); Matthias Schmidt, Dreieich (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 687 days.

(21) Appl. No.: 16/175,815

(22) Filed: Oct. 30, 2018

(65) Prior Publication Data
US 2019/0133005 A1    May 2, 2019

Related U.S. Application Data

(62) Division of application No. 14/782,011, filed as application No. PCT/IB2013/060102 on Nov. 13, 2013, now Pat. No. 10,149,416.

(30) Foreign Application Priority Data

Apr. 2, 2013    (DE) ..................... 10 2013 103 268.0

(51) Int. Cl.
H05K 9/00        (2006.01)
H01F 27/36       (2006.01)

(52) U.S. Cl.
CPC .......... *H05K 9/0075* (2013.01); *H01F 27/36* (2013.01); *H01F 27/366* (2020.08); *H05K 9/0088* (2013.01)

(58) Field of Classification Search
CPC ... H01F 27/365; H05K 9/0075; H05K 9/0088
See application file for complete search history.

(56) References Cited

U.S. PATENT DOCUMENTS

| 4,366,520 A | 12/1982 | Finke et al. |
| 5,116,434 A | 5/1992 | Keem et al. |
| 5,911,840 A | 6/1999 | Couderchon et al. |
| 6,136,429 A | 10/2000 | Saito |
| 9,507,390 B2 | 11/2016 | Jang et al. |
| 9,853,487 B2 | 12/2017 | Song et al. |
| 2004/0112468 A1 | 6/2004 | Petzold et al. |

(Continued)

FOREIGN PATENT DOCUMENTS

DE    202011051649 U1    1/2013

OTHER PUBLICATIONS

German Office Action for Priority Application No. 10 2013 103 268.0 dated Sep. 19, 2013.

*Primary Examiner* — Tabassom Tadayyon Eslami
(74) *Attorney, Agent, or Firm* — Dickinson Wright PLLC

(57) ABSTRACT

A method for manufacturing a shielding film is provided. The method includes providing a band of an amorphous soft magnetic alloy; thermally treating the band at a temperature of 500° C. to 600° C. for 1 minute to 1 hour under an N2- or H2-containing atmosphere and under the Earth's magnetic field, thereby creating a nanocrystalline soft magnetic band with a round hysteresis loop; applying an adhesive layer to at least one side of the band; and wherein the band is first applied to a substrate, then thermally treated, after which an adhesive film is applied to the band and, finally, the band is structured by breaking.

12 Claims, 11 Drawing Sheets

(56) References Cited

U.S. PATENT DOCUMENTS

| | | |
|---|---|---|
| 2007/0126546 A1 | 6/2007 | Guenther et al. |
| 2008/0070003 A1 | 3/2008 | Nakatani et al. |
| 2009/0167623 A1 | 7/2009 | Tsujimura et al. |
| 2010/0072583 A1 | 3/2010 | Oikawa et al. |
| 2011/0241613 A1 | 10/2011 | Ryu et al. |
| 2012/0057322 A1 | 3/2012 | Wallenschmidt |
| 2012/0127620 A1 | 5/2012 | Herzer |
| 2012/0236528 A1* | 9/2012 | Le .................. H05K 9/0088 361/818 |
| 2015/0123604 A1* | 5/2015 | Lee .................. B32B 38/0004 320/108 |

* cited by examiner

SHIELDING FILM AND METHOD FOR PRODUCING A SHIELDING FILM

This U.S. divisional patent application claims the benefit of U.S. application Ser. No. 14/782,011, filed 2 Oct. 2015, which is a 371 national phase entry of PCT/IB2013/060102, filed 13 Nov. 2013, which claims benefit of German Patent Application No. 10 2013 103 268.0, filed 2 Apr. 2013, the entire contents of which are incorporated herein by reference for all purposes.

BACKGROUND

1. Field

The present disclosure relates to a shielding film, for example for an apparatus with a device for cordless charging, and a method for manufacturing a shielding film.

2. Description of Related Art

A cordless charging method, so-called "wireless charging," is used to charge the battery or accumulator of a mobile device without connecting the mobile device to a power source via a mechanical connection such as a cable and/or plug.

US 2011/0241613 now abandoned discloses a battery module with a resonator for wirelessly receiving power. A film is provided which serves to shield against a magnetic field that is generated by the field-exciting coils and produces eddy currents in the metallic parts of the battery, thus generating losses while the battery is being charged. The film can be arranged between the resonator and the battery. This film can have a high permeability and low losses in order to increase the shielding performance of the film. However. US 2011/0241613 now abandoned does not discloses any additional features about this film, for example as pertains to composition or structure.

SUMMARY

The need therefore exists to provide shielding films that are suitable for use in a wireless charging system.

A shielding film that is suitable for an apparatus with a device for cordless charging is provided which comprises several layers stacked one on the other. The layers each have several strips of a nanocrystalline soft magnetic alloy arranged on an adhesive layer. The nanocrystalline soft magnetic alloy has a round hysteresis loop, and the strips of adjacent layers are offset with respect to one another.

The shielding film is thus a composite of several layers, each of which has a soft magnetic layer with the strips and an adhesive layer. The shielding film is also flexible if at least one of the soft magnetic alloys and the adhesive layers is flexible and can thus be wrapped around a component to be shielded and/or be adapted to the shape of the component to be shielded.

In order to provide the shielding effect of the shielding film, the nanocrystalline soft magnetic alloy of the shielding film should have low losses and consequently be of high quality.

According to an embodiment of the invention, the nanocrystalline soft magnetic alloy has a round hysteresis loop which increases the quality and reduces losses.

A round hysteresis loop is defined by a material with minimized anisotropy, a remanence ratio Br/Bs, and a permeability $\mu$.

The round hysteresis loop of a nanocrystalline soft magnetic alloy is created through heat treatment without the conscious application of a magnetic field, i.e., only under the influence of the Earth's magnetic field or a mechanical tension.

The hysteresis loop has a remanence ratio Br/Bs in the closed magnetic circuit from 30% to 100%, an ideal round hysteresis loop having an isotopic remanence ratio of 100%. The hysteresis loop can be measured on a toroidal core having dimensions, for example, of outer diameter $d_a$=25 mm, inner diameter $d_i$=13 mm, and core height or band width h=20 mm.

The permeability in the closed magnetic circuit measured, for example, on a toroidal core, is $\mu$(1 A/m, 50 Hz)$\geq$50,000, the permeability being measured with a magnetic field=1 A/m and a measurement frequency=50 Hz. The toroidal core can have the dimensions: $d_a$=25 mm, $d_i$=13 mm, h=20 mm, for example, where $d_a$ is the outer diameter, $d_{i\ the}$ inner diameter, h the core height or bandwidth.

For example, when manufacturing nanocrystalline band material on the coil (of any bandwidths), test toroidal cores can also be included during heat treatment in order to determine the material characteristic of a round hysteresis loop on the test toroidal cores, which represents the band material on the coil.

The quality is further increased by arranging several strips in a layer instead of a continuous film made of a nanocrystalline soft magnetic alloy. Through these separated strips, the eddy currents on the alloy plane can be spatially restricted, thus resulting in a domain refinement. Moreover, the soft magnetic characteristics are isotropic due to the round hysteresis loop, whereby magnetic fields from different directions can be shielded.

The strips of the nanocrystalline soft magnetic alloy of adjacent layers of the shielding film are offset with respect to one another. In particular, areas between the strips can be covered by a strip of the adjacent layer. This arrangement has the effect of improving the flow conductance from layer to layer and increasing the shielding performance.

This offset arrangement of the strips of adjacent layers of the shielding film can be provided in different ways. In one exemplary embodiment, the strips of adjacent layers are arranged parallel and laterally offset with respect to one another. In another exemplary embodiment, the strips of adjacent layers are arranged transverse to each other. In another exemplary embodiment, the strips of adjacent layers are woven together. For example, the woven strips can run transverse to each other and each have a wave shape.

The strips can have the shape of thin films or bands with a maximum thickness of 30 $\mu$m, for example. The strips can be manufactured using a rapid solidification technique, for example.

Some nanocrystalline soft magnetic alloys are not ductile, but rather are present in a brittle state, Examples of these alloys are nanocrystalline iron-based alloys such as $Fe_{73.8}Nb_3Cu_1Si_{15.6}B_{6.6}$, which are ductile in the amorphous state but become brittle after heat treatment in order to improve the soft magnetic characteristics. For these alloys, the adhesive layer can act as a substrate for the strips and impart a flexibility to the shielding film composite. If the adhesive layer is ductile, a flexible shielding film is provided even though the shielding film material itself. i.e., the strips of the nanocrystalline soft magnetic alloy, is brittle.

The nanocrystalline soft magnetic alloy can be iron-based. In one exemplary embodiment, the soft magnetic alloy consists of a composition of $Fe_{100-a-b-c-x-y-z}Cu_aM_bT_c\text{-}Si_xZ_z$ and up to 0.5 atom % contaminants, where M is one or more of the group consisting of Nb, Mo and Ta, T is one or more of the group consisting of V, Cr, Co and Ni, and Z is one or more of the group consisting of C, P and Ge, and 0.5 atom %<a<1.5 atom %, 2 atom %≤b<4 atom %, 0 atom %≤c<5 atom %, 12 atom %<x<18 atom %, 5 atom %<y<12 atom % and 0 atom %≤z<2 atom %.

One example of this type of alloy is the nanocrystalline soft magnetic alloy $Fe_{73.8}Nb_3Cu_1Si_{15.6}B_{6.6}$, which is commercially available under the trade name VITROPERM® 800.

In one exemplary embodiment, the nanocrystalline soft magnetic alloy has a hysteresis loop with a ratio of remanence induction, $B_r$, over saturation induction, $B_s$, $B_r/B_s$, in the closed magnetic circuit from 30% to 100%. The soft magnetic characteristics are thus even more isotropic.

The nanocrystalline soft magnetic alloy has a frequency-dependent permeability $\mu=\mu'+i\mu''$ and a quality factor $Q(f)=\mu'/\mu''$. In one exemplary embodiment, the maximum quality factor $Q_{max}>20$. This further reduces the losses and further increases the shielding performance.

As already mentioned above, the strips can have the shape of a thin film or of a band and can be manufactured using rapid solidification technology, for example. The quality increases as the thicknesses decrease. In one exemplary embodiment, the strips have a thickness, d, where d≤22 µm. In one exemplary embodiment, the strips have a thickness of 18 µm±3 µm.

In one exemplary embodiment, adjacent strips of a layer are spaced apart from one another by 0.1 mm to 0.3 mm. If the spacing is kept small, the density of the soft magnetic alloy and the flow conductance can be increased.

The adhesive layer can a self-supporting adhesive film that is adhesive on one or both sides. The adhesive layer can also be applied to the strips in liquid form or as a powder.

In one exemplary embodiment, an adhesive film is arranged between the strips of adjacent layers. The adhesive film can act as a substrate for the strips and can be present instead of or in addition to the adhesive layer. This film can be adhesive on both sides. The uppermost and/or lowermost layer of the shielding film can also be covered by an adhesive film. This adhesive film can act as a protective film and/or as an adhesive surface.

An object with a battery, a receiver for the wireless reception of power, and a shielding film according to any one of the preceding exemplary embodiments is also provided. The object can be a portable mobile device, such as a cell phone, whose battery must be recharged over and over again. A battery is understood as an accumulator that can be recharged by an external power source.

The shielding film can be arranged in various places in the object. For example, the shielding film can be arranged between the battery and the receiver or around electronic components of the object.

If the object further comprises a housing with an inner surface, the shielding film can be arranged on the inner surface. For example, the shielding film can be arranged on the inner surface such that electronic components of the device are shielded against an external magnetic field.

If the shielding film is flexible, it can be wound around surfaces to be shielded and/or adapted thereto.

The shielding film can also be arranged in the second part of the wireless charging system. An object is thus provided which comprises a transmitter for the wireless transmission of power to a receiver and a shielding film according to any one of the preceding exemplary embodiments. This object is typically connected mechanically to a power source.

The shielding film can be arranged on the transmitter or on an inner surface of a housing of the object.

The receiver and the transmitter can have different shapes. For example, the receiver and/or the transmitter can have a resonant circuit and/or a coil.

A method for manufacturing a shielding film is also provided which comprises the following: A band of an amorphous soft magnetic alloy is readied. The band is heat-treated at a temperature of 500° C. to 600° C. from 1 minute to 1 hour under an $N_2$— or $H_2$-containing atmosphere and under the Earth's magnetic field, a nanocrystalline soft magnetic band being created with a round hysteresis loop. An adhesive layer is applied to at least one side of the band, thus creating a layer. The band is structured so as to produce several strips from the band. At least two layers are stacked one on top of the other, so that the strips of adjacent layers are offset with respect to one another, thus creating a shielding film.

A shielding film can also consist of one layer of the cut strips, the strips being held together by an adhesive film.

To increase the soft magnetic characteristics, the band is heat-treated at a temperature of 500° C. to 600° C. from 1 minute to 1 hour under an $N_2$— or $H_2$-containing atmosphere. An additional external magnetic field is not applied during the heat treatment, so that the heat treatment occurs only under the influence of the Earth's magnetic field in order to produce a round hysteresis loop in the band.

Different sequences of some of these steps can be used. In one exemplary embodiment, the amorphous band is first applied to a substrate and then heat-treated, upon which an adhesive film is applied to the nanocrystalline band. The band is then structured so as to produce several strips from the nanocrystalline soft magnetic alloy on the adhesive layer.

In an alternative exemplary embodiment, the amorphous band is structured so as to produce several strips, upon which the strips are heat-treated in order to produce the nanocrystalline soft magnetic alloy, and then an adhesive film is applied to the strips.

In another exemplary embodiment, amorphous bands are woven together and then heat-treated. These bands can also be strips that are cut from an amorphous band like in the previous exemplary embodiment.

A one-sided or two-sided adhesive film or heat-sealable film or powdered hot glue can be used as the adhesive layer. Two or more different materials for different adhesive layers can be used in a shielding film.

The heat treatment can be done in a continuous pass. This method can be used in the case of a woven structure or in a step sequence in which the band or the strips are heat-treated.

The band can be structured using various methods in order to produce the strips. For example, the band can be cut mechanically or chemically into several strips. The band can be cut mechanically into several strips using rolling scissors or pulled against a sharp edge under tensile force in order to divide the band into several parts or fragments. These several parts or fragments act as several strips.

In another exemplary embodiment, shielding parts are punched or cut from the band with an amorphous alloy or from the band with a nanocrystalline alloy.

These shielding parts can then be stacked one on top of the other in order to produce a multilayer shielding film. In the case of shielded parts of an amorphous alloy, the parts can be stacked before or after the heat treatment.

The use of a shielding film according to any one of the preceding exemplary embodiments in an object with components for wireless charging is also provided. Components for wireless charging can be a coil and/or a resonator circuit, for example.

Moreover, the shielding film according to any one of the preceding exemplary embodiments can be used in an object with components to be shielded. Components to be shielded can be prone to failure under the influence of an external magnetic field. For example, the components to be shielded can be one or more of the group consisting of electronic components, cables, sensor regions and hollow spaces.

BRIEF DESCRIPTION OF DRAWINGS

Exemplary embodiments and certain examples will now be explained in further detail with reference to the drawings and table.

FIG. 2b shows a cross section of the layer of the shielding film of FIG. 2a,

DETAILED DESCRIPTION OF SPECIFIC EMBODIMENTS

Figure 1:
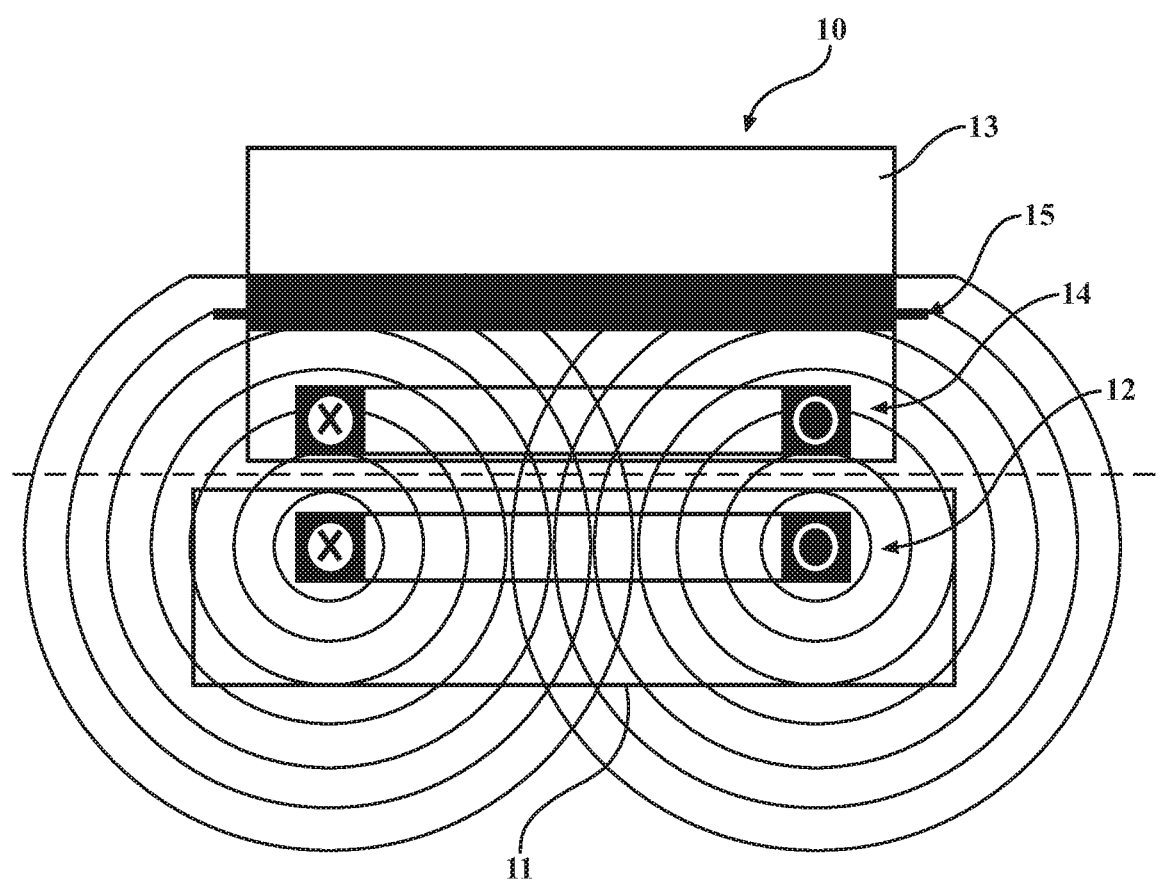
FIG. 1 shows a schematic representation of a wireless charging system.

FIG. 1 shows a schematic representation of a system 10 for the cordless charging—"wireless charging"—of a device 13. The system 10 has a first part 11 with a transmitter coil 12 for transmitting power to a separate device 13, for example a mobile or portable device such as a cell phone having a receiver coil 14 for receiving power.

The first part 11 is connected to a power source, for example via a cable and plug. The power that is transmitted wirelessly from the transmitter coil 12 of the first part 11 to the receiver coil 15 in the separate device 13 is used there to charge a battery or accumulator (not shown).

The mobile device 13 has a shielding film 15 that shields against the penetration of the magnetic field into the device 13 or into electronic components of the device 13. The shielding film can be arranged on the interior of the device 13 and/or between the coil and the battery to be charged. Two or more shielding films can be integrated into the device 13. One or more shielding films 15 can also be integrated into the first part 11.

Figure 2A:
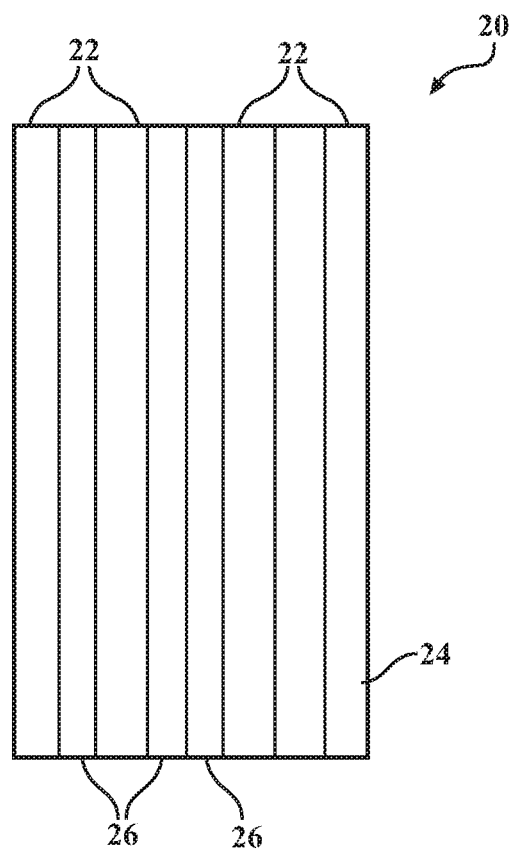
FIG. 2a shows a top view of a layer of a shielding film.
Figure 2B:
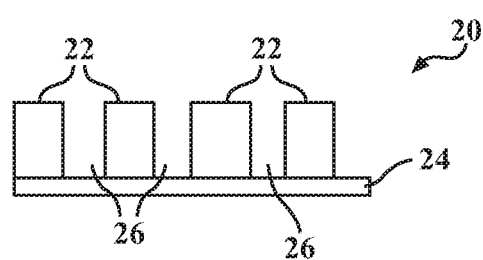

FIG. 2a shows a top view and FIG. 2b a cross section of a layer 20 of a shielding film according to a first exemplary embodiment that can be used as a shielding film in a wireless charging system.

The layer 20 has several strips 22 of a nanocrystalline soft magnetic alloy. In this exemplary embodiment, this alloy is an iron-based alloy and particularly $Fe_{73.8}Nb_3Cu_1Si_{15.6}Si_{15.6}B_{6.6}$. The strips 22 are arranged parallel to one another and on an adhesive layer 24, which is a one-sided adhesive film in this exemplary embodiment. The adhesive film acts as a substrate for the strips 22. The strips 22 are arranged on a plane and separated from one another by gaps 26 that are bridged over by the adhesive layer 24.

Figure 2C:
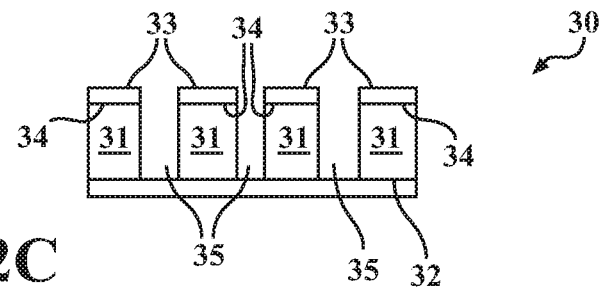
FIG. 2c shows a cross section of a layer of a shielding film with an additional adhesive layer.

FIG. 2c shows a layer 30 according to a second exemplary embodiment for a shielding film. The layer 30 has a plurality of strips 31 of a nanocrystalline soft magnetic alloy that are also arranged on an adhesive layer 32. The layer 30 has an additional adhesive layer 33 that is arranged on the upper sides 34 of the strips 31, so that the strips 31 are arranged between two adhesive layers 32, 33. In this exemplary embodiment, the gaps 35 between the strips 31 are not covered by the second adhesive layer 32, and these areas of the adhesive layer 32 are therefore open.

Figure 3:
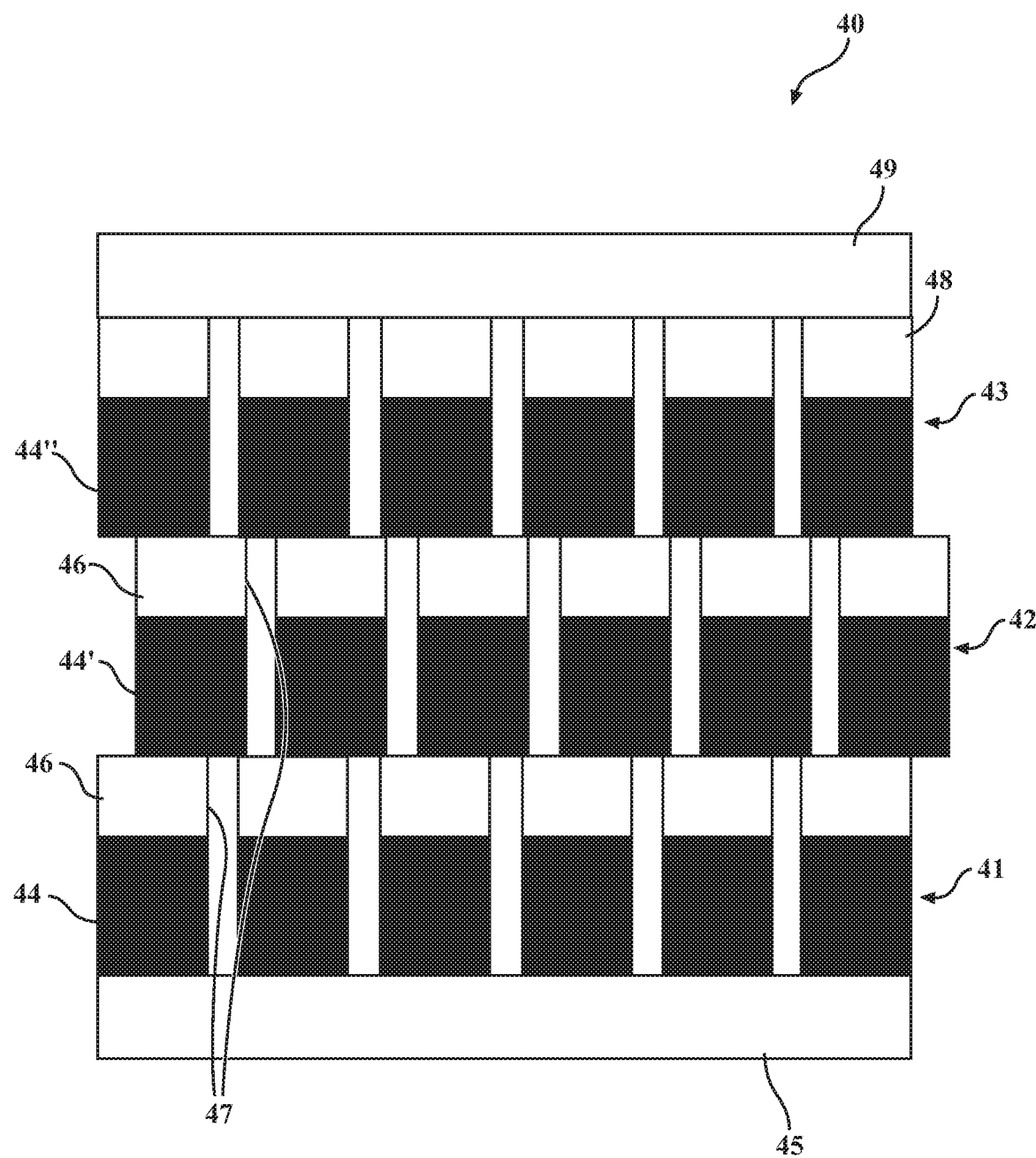
FIG. 3 shows a cross section of a layer of a shielding film with several layers according to a first exemplary embodiment.

FIG. 3 shows a cross section of a shielding film 40 according to a first exemplary embodiment. The shielding film 40 has three layers 41, 42, 43, each of which has a plurality of parallel strips 44, 44'., 44" of a nanocrystalline soft magnetic alloy and at least one adhesive layer 45. The lowermost layer 41 has a continuous adhesive film 45 that forms an outer surface of the shielding film 40.

A plurality of strips 44 are arranged on this adhesive film 45. A second adhesive layer 46 is arranged on the upper sides 47 of the strips 44.

The second layer 42 has a plurality of strips 44' that are also arranged parallel to each other on a plane. The strips are arranged on the second adhesive layer 46 of the first layer 41, the strips 44' of the second layer 42 being offset laterally in relation to the strips 44 of the first layer 41, so that an area of the strip 44' of the second layer 42 covers the gaps between the strips 44 of the first layer 41. The second layer 42 also has an adhesive layer 46, which is arranged on the upper sides 47 of the strips 44'.

Like the other two layers 41, 42, the third layer 43 of the shielding film 40 has a plurality of parallel strips 44" on whose upper side 47 an adhesive layer 48 is arranged. The strips 44" of the third layer 43 are arranged on the adhesive layer 46 of the second layer 42, so that the strips 44" of the third layer 43 are offset laterally in relation to the strips 44' of the second layer 42. The strips 44" of the third layer 43 are not offset laterally in relation to the strips 44 of the first layer 42. The strips 44, 44', 44" of the three layers 41, 42, 43 run parallel to each other. A second outer adhesive film 49 is arranged on the adhesive layer 48 of the third layer 43, so that the strips 44, 44', 44" of the three layers 41, 42, 43 are arranged between two adhesive films 45, 49.

Figure 4A:
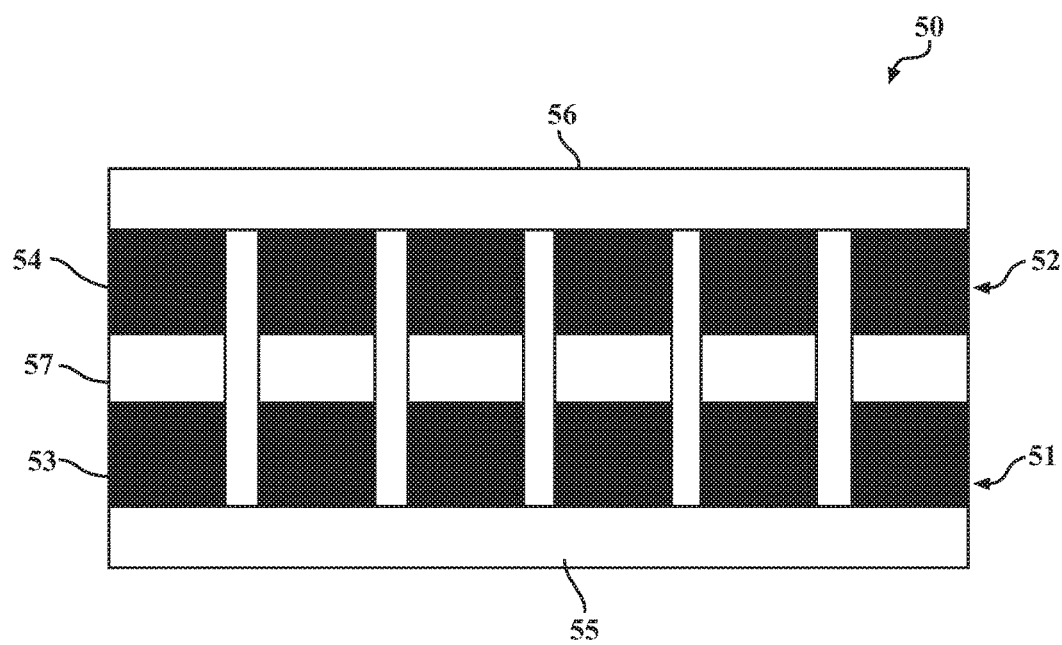
FIG. 4a shows a cross section of a layer of a shielding film according to a second exemplary embodiment.
Figure 4B:
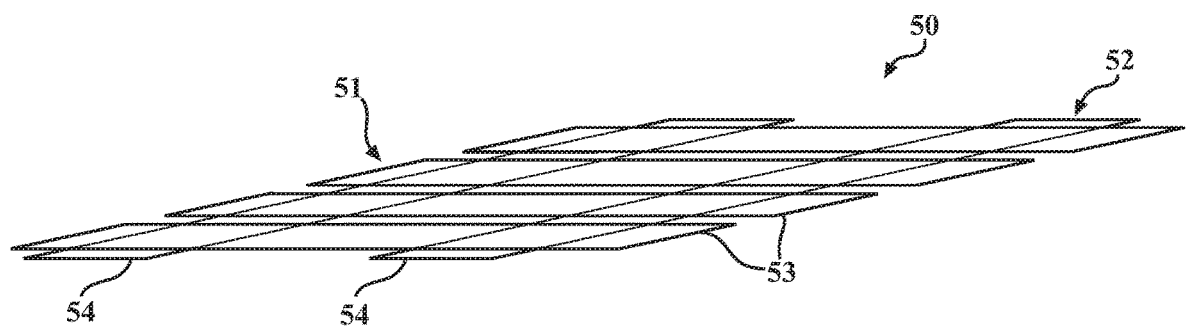
FIG. 4b shows a perspective view of the layers of the shielding film of FIG. 3a, FIG. 5 shows a schematic representation of a shielding film according to a third exemplary embodiment.

FIG. 4a shows a cross section and FIG. 4b a perspective view of a shielding film 50 according to a second exemplary embodiment. The shielding film 50 has two layers 51, 52, each layer 51, 52 having a plurality of parallel strips 53, 54 of a nanocrystalline soft magnetic alloy that are arranged on an adhesive film 55, 56. The strips 53 of the lower layer 51 further comprise an adhesive layer 57 on its upper sides 58. The strips 54 of the upper layer 52 are arranged transverse to the strips 53 of the first layer 51, so that the strips 54 of the upper layer 52 bridge over the gaps 59 between the strips 53 of the lower layer 51, and the strips 53 of the lower layer 51 bridge over the gaps 59 between the strips 54 of the upper layer 52. The two adhesive films 55, 56 form the outer surface of the shielding film 50. The adhesive layer 57 is thus arranged between the strips 53, 54 and between the layers 51, 52 of the shielding film 50.

Figure 5:
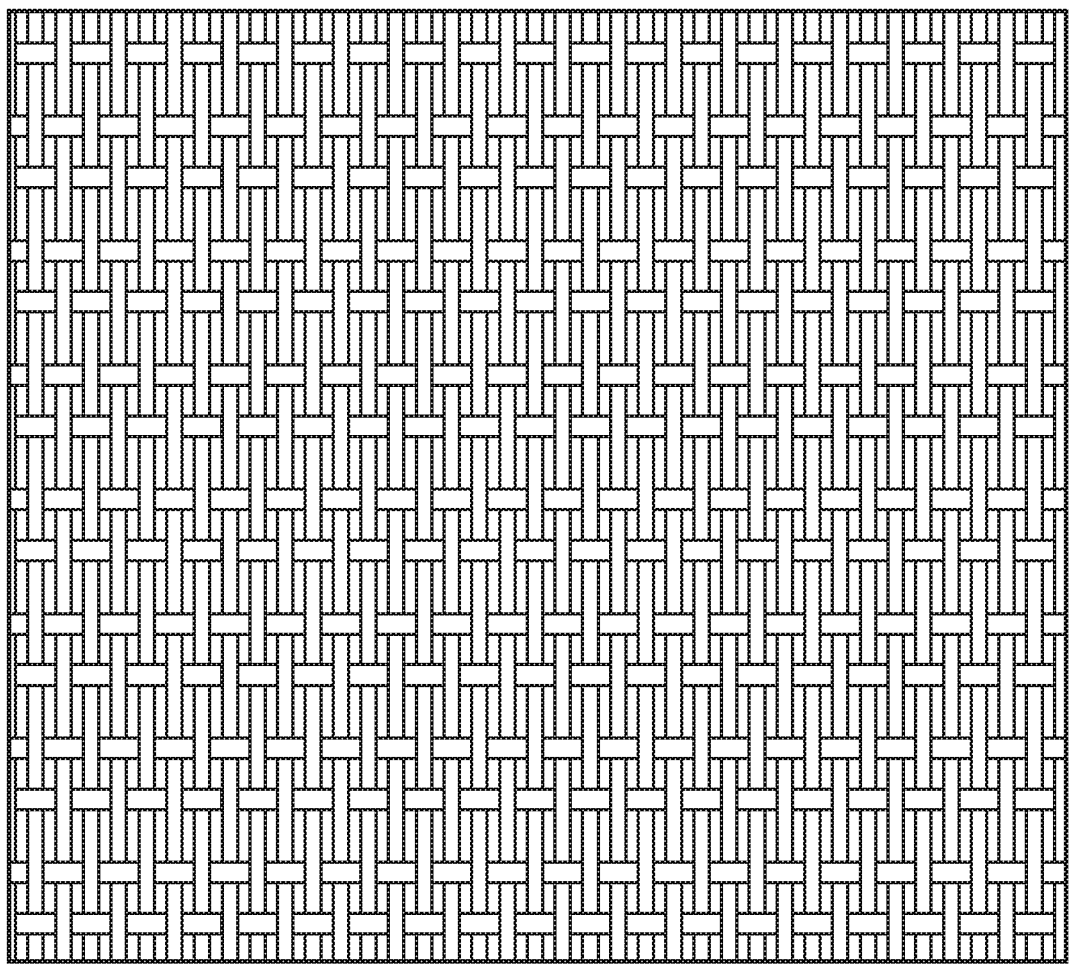

FIG. 5 shows a shielding film 60 according to a third exemplary embodiment. The shielding film 60 has two layers 61, 62, each of which has a plurality of strips 63, 64 of a nanocrystalline soft magnetic alloy and an adhesive layer 65, 66, the adhesive layer 65, 66 being arranged on a side 67 of the strips 63, 64. In this exemplary embodiment, the strips 63, 64 of the two layers 61, 62 run transverse to each other and are woven together in order to produce a woven structure in which each strip 63, 64 is wave-shaped.

To increase the shielding performance, the soft magnetic alloy should have the following characteristics: a high permeability, as little loss as possible in the frequency range >100 kHz, and as high a quality factor as possible in the frequency range >100 kHz.

Below, quality measurements performed on planar inductors are described. On the basis of the exemplary embodiments, selections can be made in terms of material, band thickness, heat treatment method and structuring. The heat treatment of the specimens was performed on a stack of about 50 individual parts. For the examples, the VITROVAC® alloys VC 6025 I50, VC 6155 U55 with the composition $Fe_{69.5}Nb_{3.5}Mo_3Si_{16}B_7$ and $Co_{72.7}Fe_{4.8}Si_{5.5}B_{17}$, respectively, and the VITROPERM® alloy VP 800 with the composition $Fe_{73.8}Nb_3Cu_1Si_{15.6}B_{6.6}$ were used.

The material quality measurements were carried out with the aid of a planar coil and an LC measuring bridge. The square or round specimens were placed at a minimal distance (e.g., about 0.2 to 0.3 mm) to one side of the planar coil. All of the results shown subsequently relate to a single material layer. Depending on the application, however, a shielding film or a shielding part can have several soft magnetic layers.

Figure 6:
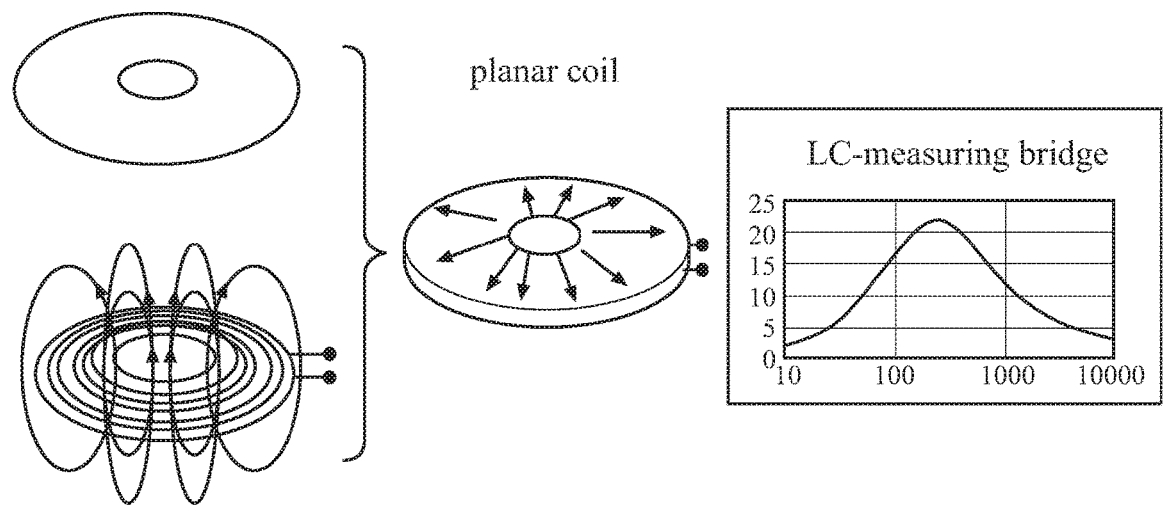
FIG. 6 shows a schematic view of the experimental setup for performing frequency-dependent quality measurements on flat, round specimens.

FIG. 6 shows a schematic view of the experimental setup for the frequency-dependent quality measurement on flat, round specimens.

Figure 7:
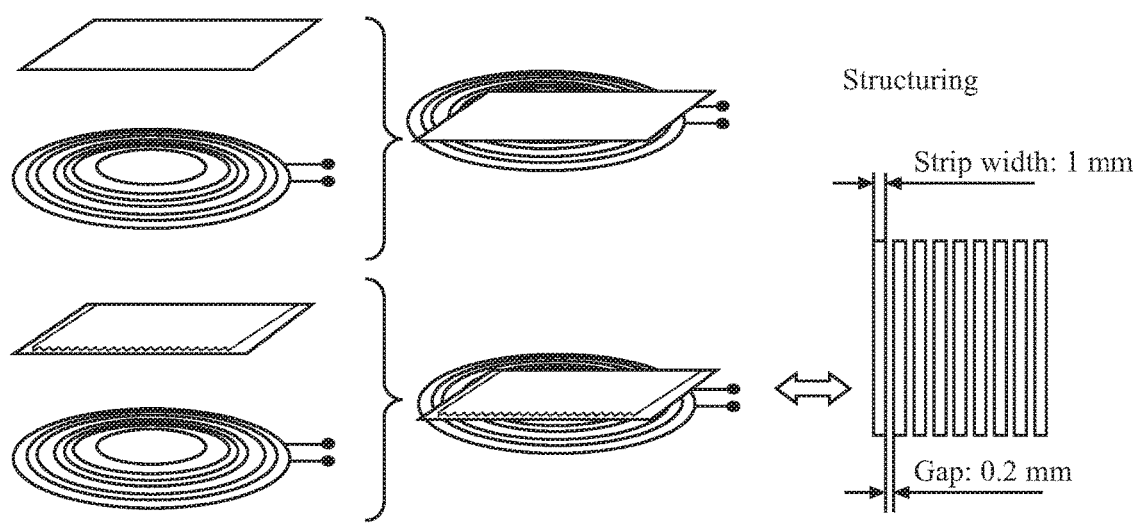
FIG. 7 shows a schematic view of an experimental setup for performing frequency-dependent quality measurements.

FIG. 7 shows a schematic view of an experimental setup for the frequency-dependent quality measurement on flat, square specimens (top) and on flat, square specimens with inner structuring in order to produce strips from the specimen. The strips have a strip width of 1 mm, a distance between the strips of 0.2 mm and can be produced through laser-cutting using a Q-switch laser, for example, or through cutting with rolling scissors, for instance, into strips and subsequent assembly.

FIGS. 6 and 7 show the experimental setup for determining the frequency-dependent quality. An LC measuring bridge is used to determine the frequency-dependent complex permeability $\mu=\mu'+\mu''$ of a planar inductor. The inductor is composed of the coil and the placed specimen. The quality factor is calculated from:

$$Q(f)=\mu'/\mu''$$

and since the cycle losses due to eddy currents are determined only from the imaginary part of the permeability, a high quality factor is obtained in those frequency ranges in which the material losses are small.

The influence of the alloy system on the quality was examined.

Figure 8:
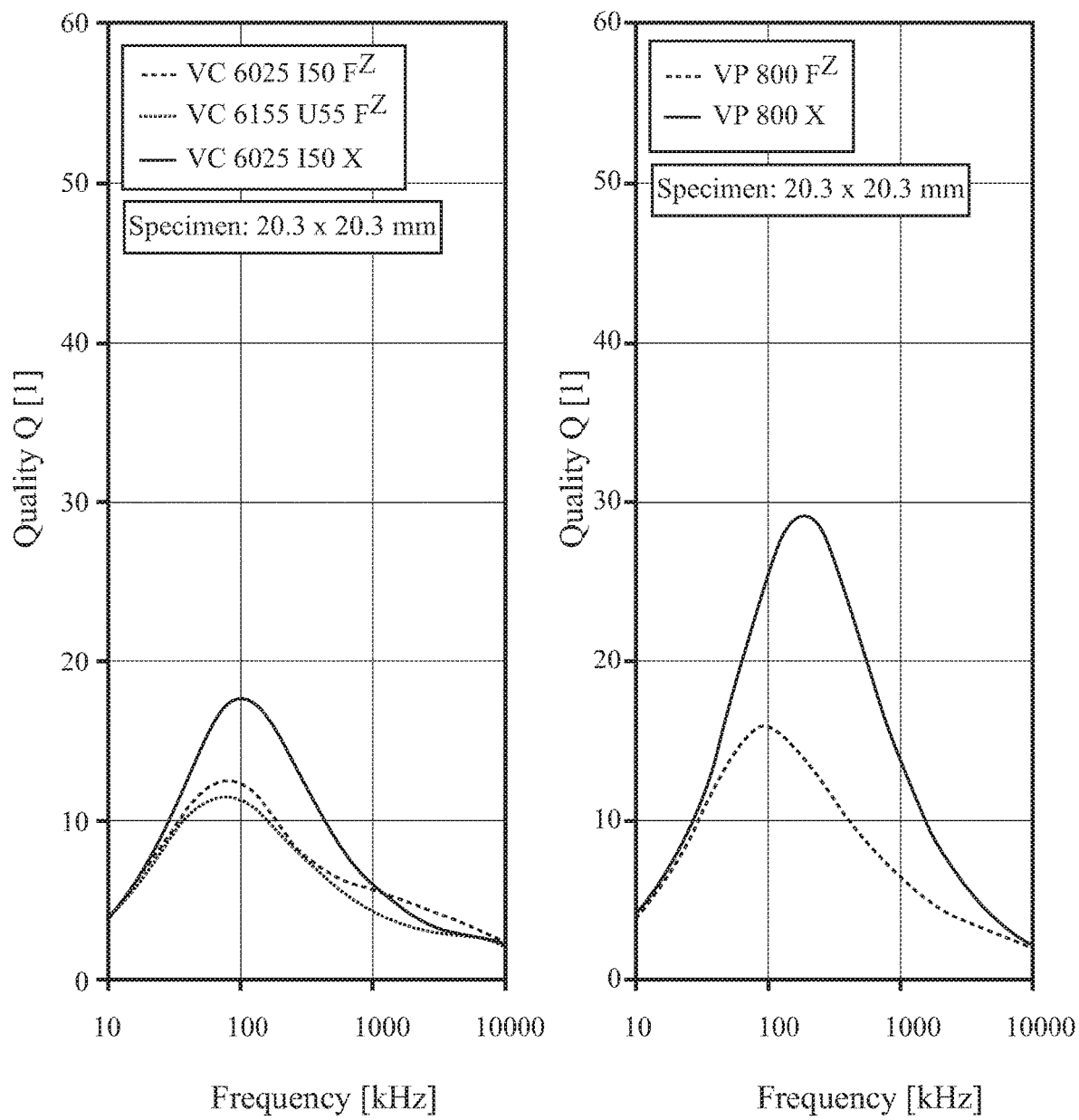
FIG. 8 shows diagrams of quality as a function of frequency for specimens with different hysteresis loops.

FIG. 8 shows diagrams of quality as a function of frequency. The frequency-dependent quality was measured on specimens having a geometry of 20.3×20.3 cm. The results for Co-based alloys such as VC 6025 50 and VC 6155 U55 are shown on the left side, and results for the monocrystalline Fe-based alloy VP 800 are indicated on the right side. For both material classes, the specimens are present after a heat treatment without a magnetic field, which are designated by X, and with a magnetic field, which are designated by F and Z.

The material parameters, the heat treatment status and the maximum achievable quality values are summarized in table 1 for the illustrated examples. By comparing the maximum achievable quality values, one can see that higher quality values can be achieved with Fe-based alloys in the nanocrystalline state.

Figure 9:
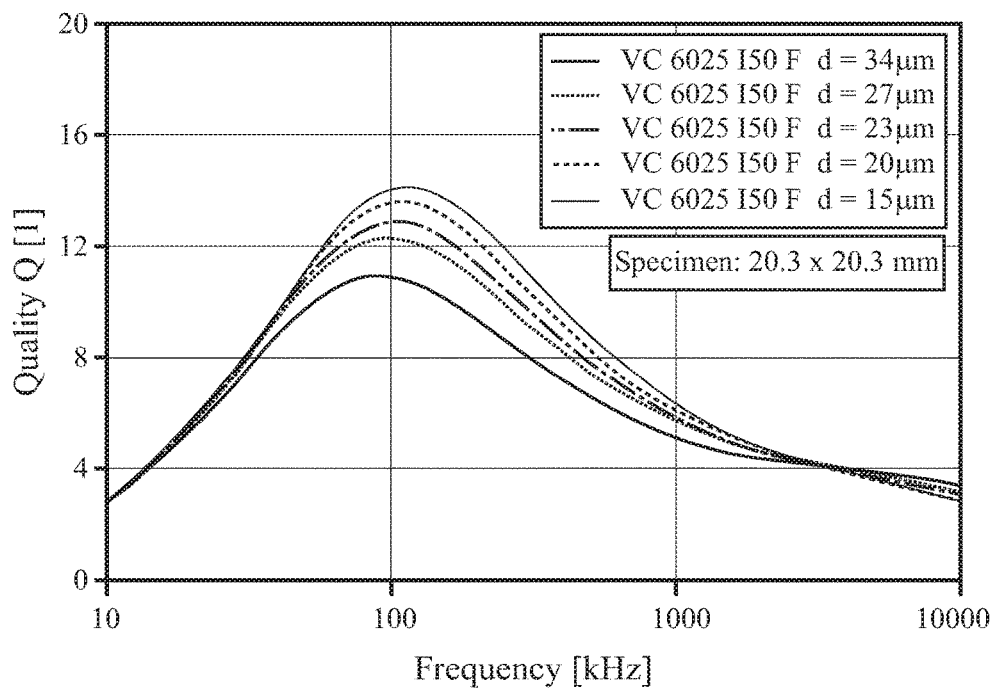
FIG. 9 shows a diagram of quality as a function of frequency for specimens of different thickness.

FIG. 9 shows a diagram of quality as a function of frequency for samples having a geometry $d_a$=28 mm $d_i$=10 mm of the Co-based alloy VC 6025 50 with different band thicknesses in the range from 15 µm to 34 µm.

Figure 10:
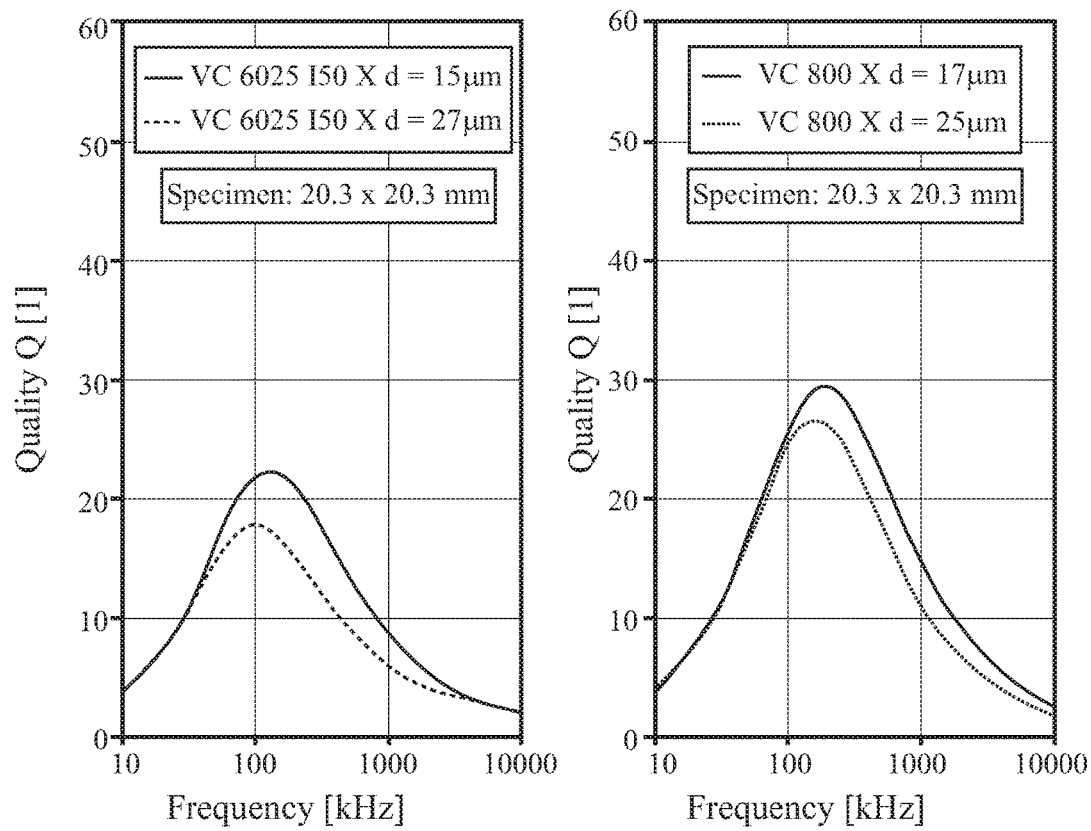
FIG. 10 shows diagrams of quality as a function of frequency for specimens of different thickness.

FIG. 10 shows diagrams quality as a function of frequency. The frequency-dependent quality was measured on specimens having a geometry of 20.3 mm×20.3 mm with different band thicknesses for the alloys VC 6025 50 and the alloy VP800 in the nanocrystalline state. The band thickness of the specimens was 15 µm and 27 µm, and a heat treatment was used that is suitable for producing a round hysteresis loop.

The eddy current losses are reduced with increasing material thickness. Accordingly, the highest quality values are achieved in the smallest band thicknesses, as can be seen from FIG. 8, FIG. 10 and from table 1.

The influence of the heat treatment with and without magnetic field on the quality was investigated.

Heat treatment of the materials cited above can be performed with and without the application of magnetic fields. Through the application of magnetic fields during a heat treatment, aligned anisotropes can be introduced into soft magnetic specimens. A heat treatment without a magnetic field yields specimens with round hysteresis loops having only a very small residual anisotropy. These samples are designated by the letter "X."

If a magnetic field is applied during heat treatment transverse to the band longitudinal direction, a transverse anisotropy is obtained in the specimen, which leads, when measured in the band direction, to a "flat" hysteresis loop that is designated by the letter "F."

Likewise, it is possible to apply the magnetic field parallel to the band longitudinal direction during the heat treatment. In that case, one obtains a longitudinal anisotropy in the specimen, which leads, when measured in the band direction, to a "Z-shaped" hysteresis loop. These samples are designated by the letter "Z."

One would now expect for specimens with "flat" hysteresis loops to exhibit good quality, since toroidal cores with "flat" hysteresis loops have less loss. It can be seen from FIG. 6 and table 1, however, that specimens with "round" hysteresis loops (X) have substantially higher quality values than specimens with "flat" hysteresis loops (F). An explanation of this is given in FIG. 9. In the square specimen, the radially symmetrical magnetic field of a planar coil leads to areas with "flat" hysteresis (direction of anisotropy normal to the field line (.L)) and to areas with "Z-shaped" hysteresis loops (direction of anisotropy parallel to the field line (II)). Both areas occur in the specimens.

Figure 11:
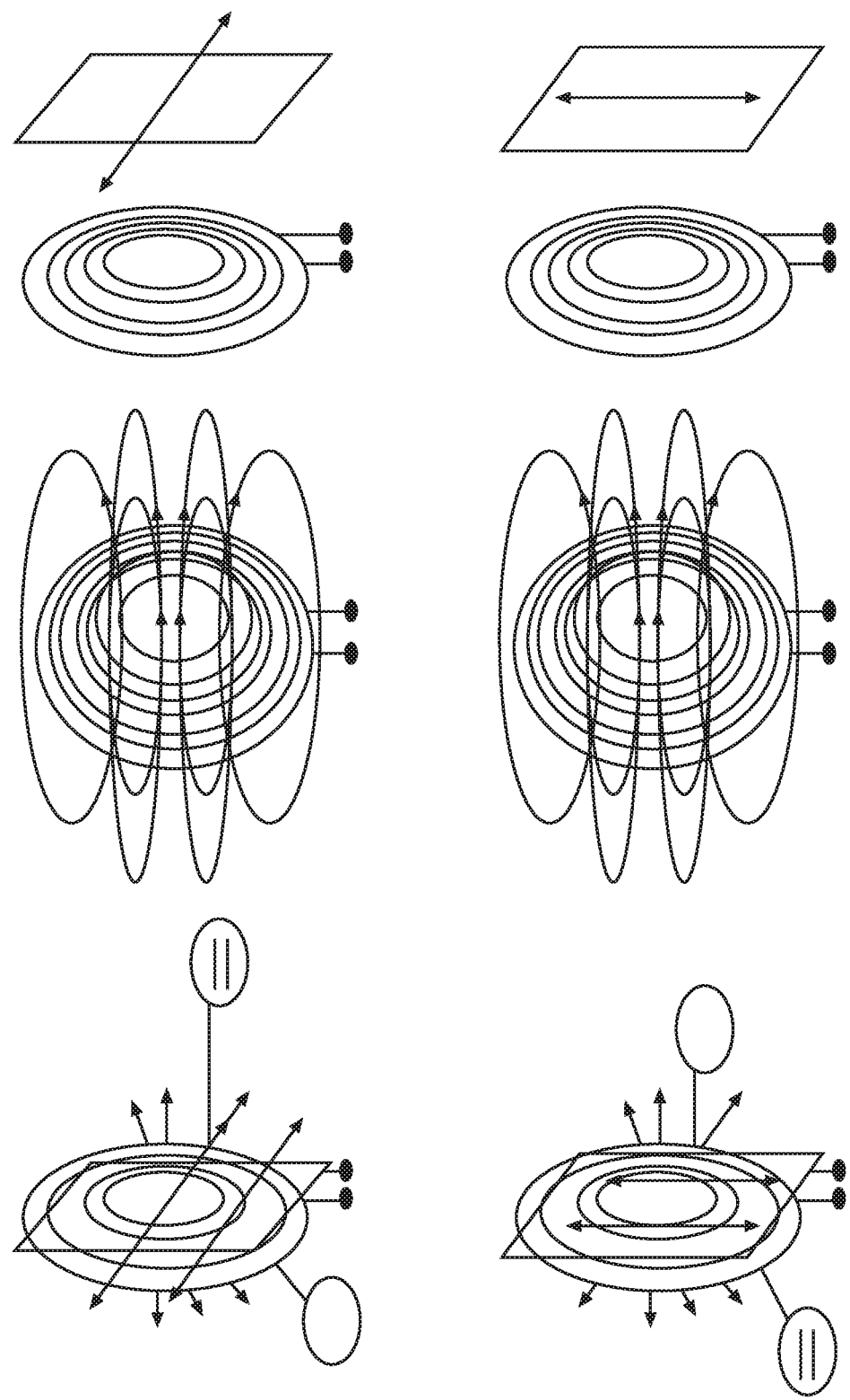
FIG. 11 shows a schematic representation of the induced anisotropy in a square specimen on a planar inductor.

FIG. 11 shows a schematic representation of the induced anisotropy (transverse, longitudinal) in a square specimen on a planar inductor. In both cases, there are areas in which the induced anisotropy is aligned parallel (||) and in which the anisotropy is aligned normal to the magnetic field profile in the specimen.

Toroidal cores with "Z-shaped" hysteresis loops exhibit high losses. Due to the mixed state, planar specimens with an "F" or "Z" heat treatment are therefore more prone to losses and thus exhibit lower quality. In the case of square specimens (here 20.3×20.3 mm) that are used in a radially symmetrical coil arrangement (see FIG. 9), there is no distinction between specimens with longitudinal (Z) and transverse anisotropy (F).

As shown in the exemplary embodiment in table 1, the best quality factors are obtained for nanocrystalline Fe-based alloys such as VITROPERM® 800 after heat treatment on a "round" hysteresis loop.

The influence of a coating with adhesive film on the quality was examined.

Figure 12:
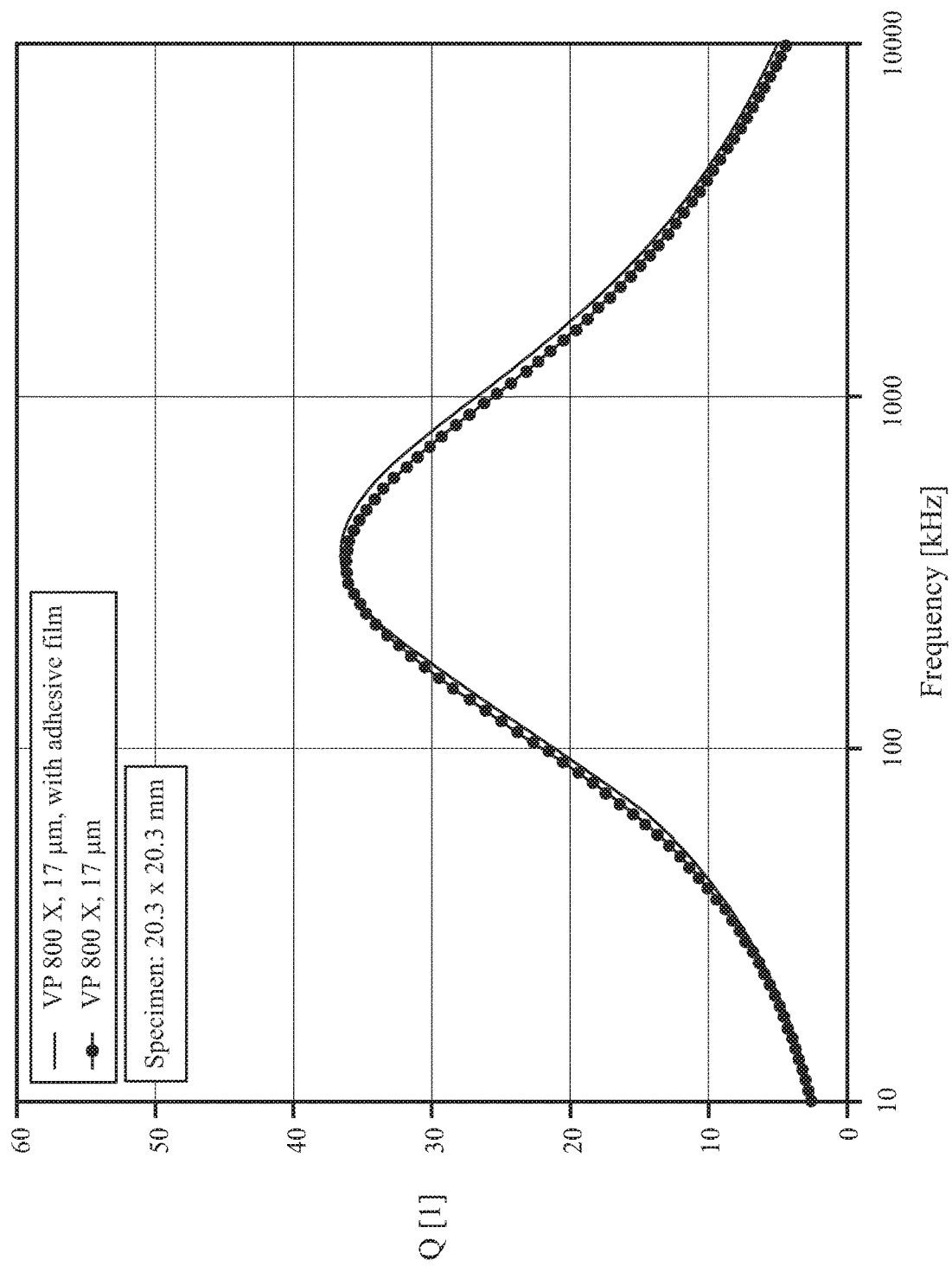
FIG. 12 shows a diagram of quality as a function of frequency for a specimen with an adhesive film.

FIG. 12 shows a diagram of the quality as a function of frequency. The frequency-dependent quality was measured on specimens with a geometry of 20.3×20.3 mm of the alloy VP800 in the nanocrystalline state with heat treatment on "round" hysteresis loops. The illustration shows a measurement on an uncoated specimen and on a specimen coated with an adhesive film. The band thickness of both specimens is 17 µm.

The influence of the coating of nanocrystalline VITROPERM® 800 specimens with adhesive band on the quality is low. Indeed, measurements of the quality profile on coated and uncoated specimens yielded very similar values, as can be seen from FIG. 10. The results have also been presented in table 1. This result is useful, since the inner structuring, for example by cutting the material on rolling scissors and subsequent joining, is only possible after coating of the nanocrystalline material with an adhesive film.

The influence of the inner structuring on the quality was also investigated.

Another increase in quality with nanocrystalline VITROPERM® 800 with "round" hysteresis loop was also achieved through inner structuring. For this purpose, narrow slits were introduced in the material plane. FIG. 10 shows a comparison of the quality profile for a nanocrystalline specimen with and without inner structuring, and that the quality can be doubled through inner structuring. The material parameters, the heat treatment status, and the quality values achieved for the individual specimens have been summarized in table 1. The reduction in losses can be explained on the one hand by the interruption of the eddy currents on the alloy plane and on the other hand by the resulting domain refinement in comparison to non-slitted specimens. The domain refinement was confirmed using a Kerr microscope.

Figure 13:
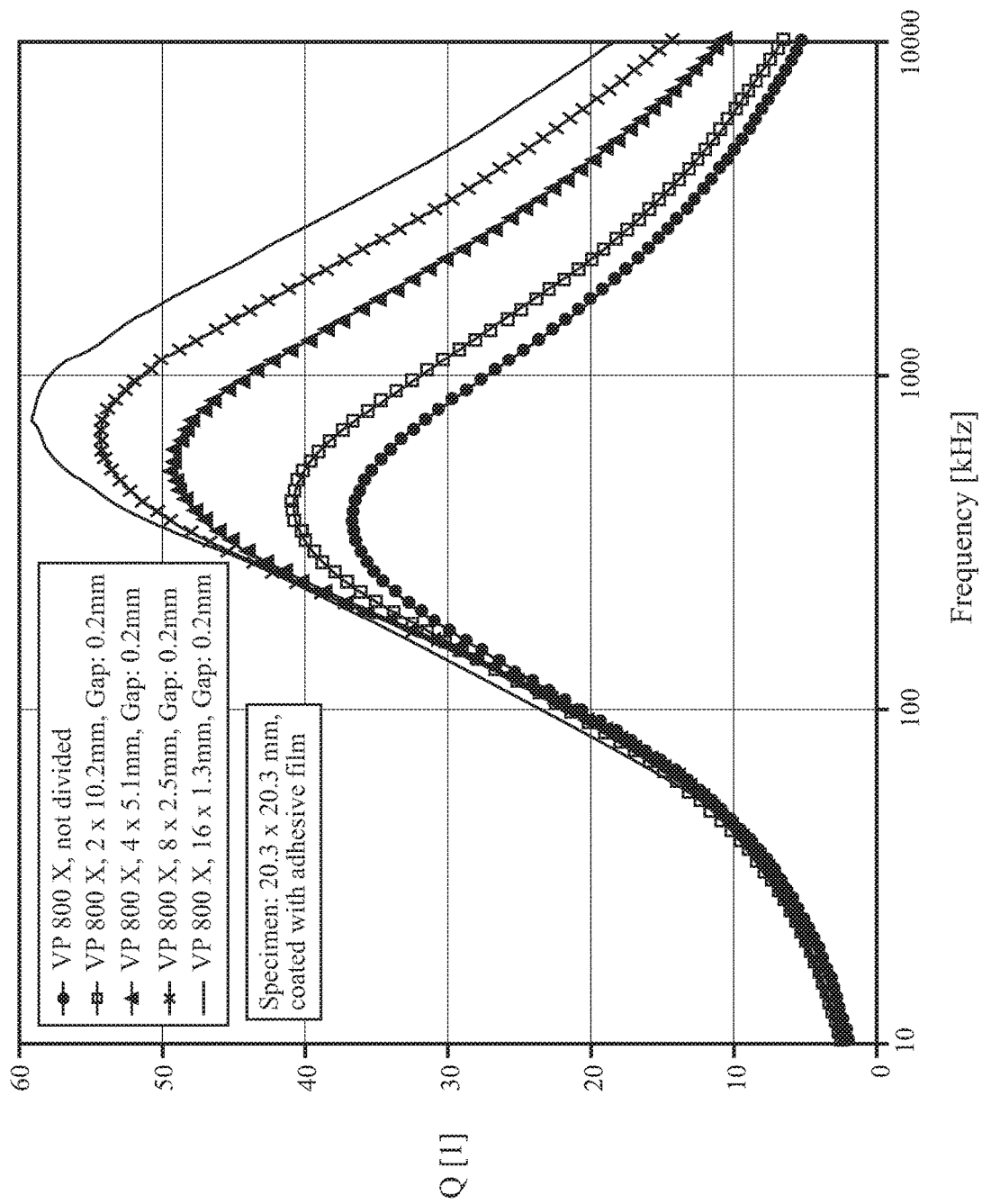
FIG. 13 shows a diagram of quality as a function of frequency for a shielding film with several strips of a nanocrystalline soft magnetic alloy.

FIG. 13 shows a diagram of the quality as a function of frequency. The frequency-dependent quality was measured on a sample with the geometry 20.3×20.3 mm of the alloy VP800 in the nanocrystalline state with heat treatment on a "round" hysteresis loop. The quality profile of the specimen was first measured in the undivided state. The specimen was then measured after it was divided into 2, 4, 8 and 16 parts, respectively. This corresponds to structures of 10.2 mm, 5.1 mm, 2.5 mm and 1.3 mm with spacing between the individual parts of 0.2 mm. The quality profile was then measured again.

The material parameters, the heat treatment status and the quality values achieved for the individual structures are summarized in table 1. FIG. 13 shows further influence of the strip width on the quality. The quality value increases as the strip width decreases. In order to achieve an efficient increase in quality, the strips of the inner structuring must be selected so as to be as narrow as possible.

To produce single-layer or multilayer shielding films or shielding parts with high quality from a nanocrystalline, soft magnetic Fe-based alloy (VITROPERM® 800), one of the following production methods can be used.

1.) Heat Treatment on the Coil=>Film Composite=>Structure=>Shielding Film or Shielding Part Using this production method, the individual processes can be carried out very cost-effectively. The starting point is represented by a directly cast or cut VITROPERM® band of any width wrapped into coils on special substrates. The coils are then heat-treated on a "round" hysteresis loop at 575° C. and under $N_2$ or $H_2$ atmosphere, the material being brought to the nanocrystalline state. The brittle band is now coated with an adhesive band in a "reel-to-reel," i.e., coil-to-coil process in order to ensure workability for ensuing steps. For a multilayer film composite (several layers of VITROPERM®), the reel-to-reel process must be carried out several times with double-sided adhesive band. By virtue of the coating with adhesive band, the otherwise brittle band material can now be subjected to additional processing steps. Shielding parts can then be manufactured directly by cutting or punching.

For shielding material that meets higher quality demands, internal structuring can be performed. The single-layer or multilayer film composite is now cut on rolling scissors into narrow strips (0.5 to 10 mm). A device is used to bring the individual strips together again on another substrate adhesive band with mutual spacing of <0.2 mm, thus resulting in a film composite as shown in FIG. 3.

For a multilayer, structured construction with offset stacking, single-layer composite films can be cut into narrow strips and brought together again. The resulting structured films can then be brought together in an offset manner as shown in FIG. 3. A similar procedure is proposed for the manufacture of cross-stacked shielding films (see FIG. 4).

2.) Part=>Structure=>Heat Treatment on the Part=>Film Composite=>Shielding Part

The production process described under 1.) provides for the mechanical processing of the material after heat treatment in a "reel-to-reel" process in which the individual shielding part is created only at the end of the production chain. In contrast to that, the heat treatment can be performed on parts that have already been prefabricated, stacked packets and structured stacked packets.

For this purpose, directly cast or cut VITROPERM® band of any width is processed. The manufacture of individual parts could be done on rolling scissors, automatic cutting machines or punches. This is followed by the heat treatment of the individual parts on a "round" hysteresis loop at 575° C. and under $N_2$ or $H_2$ atmosphere, the material being brought into the nanocrystalline state. The brittle individual parts are then coated or brought together into packets stacked in a structured manner, all of the possibilities described under 1.) being possible. A flexible shielding part is obtained by coating the heat-treated parts, the stacked packets or the structure-stacked packets with adhesive film. This adhesive film should preferably be present as a long substrate film in order to enable a subsequent reel-to-reel process.

3.) Woven Fabric of VITROPERM® Bands=>Heat Treatment=>Film Composite=>Shielding Film The starting point is represented here by a woven fabric, e.g., tube weave, of narrowly cut VITROPERM® band (see FIG. 5), the bands having a width of 0.5 to 0.6 mm, for example. The flat-lying woven fabric is subjected to heat treatment on a "round" hysteresis loop at 575° C. under $N_2$ or $H_2$ atmosphere, the material being brought into the nanocrystalline state. The now-brittle woven fabric of nanocrystalline bands is now coated while lying flat in a device with an adhesive band in order to ensure workability for ensuing steps.

For a multilayer film composite, the reel-to-reel process can be carried out several times with double-sided adhesive band. This method has the advantage that the inner structuring is already present in the form of the weave, whereby the losses are again greatly reduced and resulting here, too, in shielding material of high quality.

4.) Heat Treatment on the Coil=>Film Composite=>Structure Through Breaking=>Shielding Film The starting point is represented by a directly cast or cut VITROPERM® band wrapped into coils on special substrates. The coils are then heat-treated on a "round" hysteresis loop at 575° C. and under $N_2$ or $H_2$ atmosphere, the material being brought to the nanocrystalline state. The brittle band is now coated on both sides with an adhesive band in a "reel-to-reel" process. To increase the quality, another procedure for inner structuring is proposed here. In the described reel-to-reel process, the film composite must be pulled under tensile force over a sharp metal edge in order to break the brittle VITROPERM® band located between the films into small parts. Here, too, the eddy currents on the material plane are spatially limited, the losses are reduced and the quality factor is increased.

Further processing into multilayer shielding films or parts would be possible in a manner analogous to that described under 1.).

Instead of the abovementioned commercially available one-sided or double-sided adhesive films, which are necessary for fixing the layers of magnetic material or to achieve inner structuring, other adhesive technologies such as heat-sealable films, powdered hot adhesives or the like can be used.

Numbers 1 to 7 and 10 show comparative examples for the related art, while numbers 8, 9 and 11 to 17 show examples according to an embodiment of the invention.

Terms used in the table:
1) $J_s$: saturation polarization
2) Heat treatment:
   X—Heat treatment without magnetic field
   F—Heat treatment in the magnetic transverse field with the result of anisotropy transverse to the band longitudinal direction
   Z—Heat treatment in the magnetic longitudinal field with the result of anisotropy along the band longitudinal direction
   Amorphous—After treatment, the specimen is present in the amorphous state
   Nano—After treatment, the specimen is present in the nanocrystalline state and
3) KF: Laminated with adhesive film

The invention claimed is:

1. A method for manufacturing a shielding film, comprising the following steps:
   providing a band of an amorphous soft magnetic alloy;
   wrapping the band into a coil on a substrate;
   thermally treating the band in the form of the coil at a temperature of 500° C. to 600° C. for 1 minute to 1 hour under an $N_2$— or $H_2$-containing atmosphere and under the Earth's magnetic field, thereby creating a nanocrystalline soft magnetic band with a round hysteresis loop;
   applying an adhesive layer to at least one side of the nanocrystalline soft magnetic band by a reel-to-reel process; and
   wherein the band is structured by breaking after applying the adhesive layer.

2. The method of claim 1, wherein a one-sided or double-sided adhesive film, heat-sealable film or powdered hot adhesive is used as the adhesive layer.

3. The method of claim 1, wherein the thermal treatment is done in a continuous pass.

4. The method of claim 1, wherein the band is cut mechanically into several strips.

TABLE 1

| No. | Material | Js [T] | Thickness d [μm] | Heat treatment[2] | Inner structure | Quality $Q_{max}$[ ] | Frequency at $Q_{wax}$ f [kHz] |
|---|---|---|---|---|---|---|---|
| 1 | VC 6155 U55 | 0.99 | 23 | F, Z, amorphous | none | 11.5 | 70 |
| 2 | VC 6025 I50 | 0.55 | 34 | F, Z, amorphous | none | 11.0 | 80 |
| 3 | VC 6025 I50 | 0.55 | 27 | F, Z, amorphous | none | 12.3 | 90 |
| 4 | VC 6025 I50 | 0.55 | 23 | F, Z, amorphous | none | 12.9 | 100 |
| 5 | VC 6025 I50 | 0.55 | 20 | F, Z, amorphous | none | 13.6 | 106 |
| 6 | VC 6025 I50 | 0.55 | 15 | F, Z, amorphous | none | 14.2 | 112 |
| 7 | VC 6025 I50 | 0.55 | 27 | X, amorphous | none | 17.5 | 100 |
| 8 | VC 6025 I50 | 0.55 | 15 | X, amorphous | none | 22.2 | 130 |
| 9 | VC 6025 I50 + KF[3] | 0.55 | 27 | X, amorphous | none | 29.9 | 130 |
| 10 | VP 800 | 1.21 | 17 | F, Z, nano | none | 15.8 | 100 |
| 11 | VP 800 | 1.21 | 25 | X, nano | none | 26.2 | 170 |
| 12 | VP 800 | 1.21 | 17 | X, nano | none | 35.5 | 350 |
| 13 | VP 800 + KF[3] | 1.21 | 17 | X, nano | none | 35.9 | 360 |
| 14 | VP 800 + KF[3] | 1.21 | 17 | X, nano | 10.2 mm 0.2 mm | 41.1 | 410 |
| 15 | VP 800 + KF[3] | 1.21 | 17 | X, nano | 5.1 mm 0.2 mm | 49.2 | 510 |
| 1 | VP 800 + KF[3] | 1.21 | 17 | X, nano | 2.5 mm 0.2 mm | 54.2 | 630 |
| 1 | VP 800 + KF[3] | 1.21 | 17 | X, nano | 1.3 mm 0.2 mm | 59.2 | 770 |

5. The method of claim 1, wherein the band is cut mechanically with rolling scissors into several strips.

6. The method of claim 1, wherein the band is pulled under tensile force over a sharp edge in order to divide the band into several parts.

7. The method of claim 1, wherein shielding parts are punched or cut from the band with a nanocrystalline alloy.

8. The method of claim 1, wherein the soft magnetic alloy consists of a composition of $Fe_{100-a-b-c-x-y-z}Cu_aM_bT_cSi_xZ_z$ and up to 0.5 atom % contaminants, where M is one or more of the group consisting of Nb, Mo and Ta, T is one or more elements selected from the group consisting of V, Cr, Co and Ni; and Z is one or more elements selected from the group consisting of C, P and Ge; and wherein 0.5 atom %<a<1.5 atom %, 2 atom %<b<4 atom %, 0 atom %<c<5 atom %, 12 atom %<x<18 atom %, 5 atom %<y<12 atom % and 0 atom %<z<2 atom %.

9. The method of claim 8, wherein the nanocrystalline soft magnetic alloy is $Fe_{73.8}Nb_3Cu_1Si_{15.6}B_{6.6}$.

10. The method of claim 1, wherein the nanocrystalline soft magnetic alloy has a hysteresis loop with a ratio of remanence induction, $B_r$, over saturation induction, $B_s$, $B_r/B_s$, in the closed magnetic circuit from 30% to 100%.

11. The method of claim 1, wherein the nanocrystalline soft magnetic alloy has a frequency-dependent permeability $\mu=\mu'+i\mu''$ and a quality factor $Q(f)=\mu'+\mu''$, such that the maximum quality factor $Q_{max}$ is >22.

12. A method for manufacturing a shielding film, comprising the following steps:
   providing a band of an amorphous soft magnetic alloy;
   thermally treating the band in a continuous process at a temperature of 500° C. to 600° C. for 1 minute to 1 hour under an $N_2$— or $H_2$-containing atmosphere and under the Earth's magnetic field, thereby creating a nanocrystalline soft magnetic band with a round hysteresis loop;
   applying an adhesive layer to at least one side of the nanocrystalline soft magnetic band by a reel-to-reel process; and
   structuring the band by breaking after applying the adhesive layer.

* * * * *